United States Patent
Goyal et al.

(10) Patent No.: US 7,000,158 B2
(45) Date of Patent: Feb. 14, 2006

(54) SIMPLIFYING VERIFICATION OF AN SFI CONVERTER BY DATA FORMAT ADJUSTMENT

(75) Inventors: Sameer Goyal, San Jose, CA (US); Jehangir Parvereshi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 530 days.

(21) Appl. No.: 10/373,265

(22) Filed: Feb. 21, 2003

(65) Prior Publication Data

US 2004/0177291 A1   Sep. 9, 2004

(51) Int. Cl.
*H04B 10/08* (2006.01)
*H04B 17/00* (2006.01)
*G08C 25/00* (2006.01)
*H04L 12/26* (2006.01)

(52) U.S. Cl. .................. 714/715; 398/25; 398/27; 714/712

(58) Field of Classification Search .............. 398/25, 398/27; 714/715
See application file for complete search history.

(56) References Cited

U.S. PATENT DOCUMENTS

| | | | |
|---|---|---|---|
| 2003/0159094 A1 * | 8/2003 | Smith et al. | 714/715 |
| 2004/0096212 A1 * | 5/2004 | McLeod et al. | 398/25 |
| 2005/0169187 A1 * | 8/2005 | Taylor et al. | 370/248 |

* cited by examiner

*Primary Examiner*—R. Stephen Dildine
(74) *Attorney, Agent, or Firm*—Townsend and Townsend and Crew LLP

(57) ABSTRACT

The present invention enables interface conversion verification with a single chip and improves problem isolation. Exemplary embodiments of the present invention can provide this by modifying the input data pattern (e.g., creating a 40G, or pseudo OC-768, frame by multiplexing four OC-192 frames, two bytes at a time) to provide per port demultiplexing of data streams at the output of the interface converter.

22 Claims, 6 Drawing Sheets

| BIT TIME | VALUE | VALUE | VALUE | VALUE | COMMENTS |
|---|---|---|---|---|---|
| 1-32 | A1<br>1111 0110 | A1<br>1111 0110 | A2<br>0010 1000 | A2<br>0010 1000 | FRAMING BYTES |
| 33-64 | EH1<br>1010 1010 | EH2<br>1010 1010 | EH3<br>1010 1010 | EH4<br>1010 1010 | EXPANSION HEADER |
| 65-96 | RXDATA15<br>BITS 1-8 | RXDATA15<br>BITS 9-16 | RXDATA15<br>BITS 17-24 | RXDATA15<br>BITS 25-32 | 64 CONSECUTIVE BITS FROM RXDATA15 |
| 97-128 | RXDATA15<br>BITS 33-40 | RXDATA15<br>BITS 41-48 | RXDATA15<br>BITS 49-56 | RXDATA15<br>BITS 57-64 | |
| 129-160 | RXDATA14<br>BITS 1-8 | RXDATA14<br>BITS 9-16 | RXDATA14<br>BITS 17-24 | RXDATA14<br>BITS 25-32 | 64 CONSECUTIVE BITS FROM RXDATA14 |
| 161-192 | RXDATA14<br>BITS 33-40 | RXDATA14<br>BITS 41-48 | RXDATA14<br>BITS 49-56 | RXDATA14<br>BITS 57-64 | |
| 193-1024 | | | | | 64 CONSECUTIVE BITS FROM EACH OF RXDATA13 TO RXDATA1 |
| 1025-1056 | RXDATA0<br>BITS 1-8 | RXDATA0<br>BITS 9-16 | RXDATA0<br>BITS 17-24 | RXDATA0<br>BITS 25-32 | 64 CONSECUTIVE BITS FROM RXDATA0 |
| 1057-1088 | RXDATA0<br>BITS 33-40 | RXDATA0<br>BITS 41-48 | RXDATA0<br>BITS 49-56 | RXDATA0<br>BITS 57-64 | |

SIMPLIFYING VERIFICATION OF AN SFI CONVERTER BY DATA FORMAT ADJUSTMENT

FIELD OF THE INVENTION

The invention relates generally to communications and, more particularly, to verification of interface conversion in optical networks.

BACKGROUND OF THE INVENTION

Figure 1:
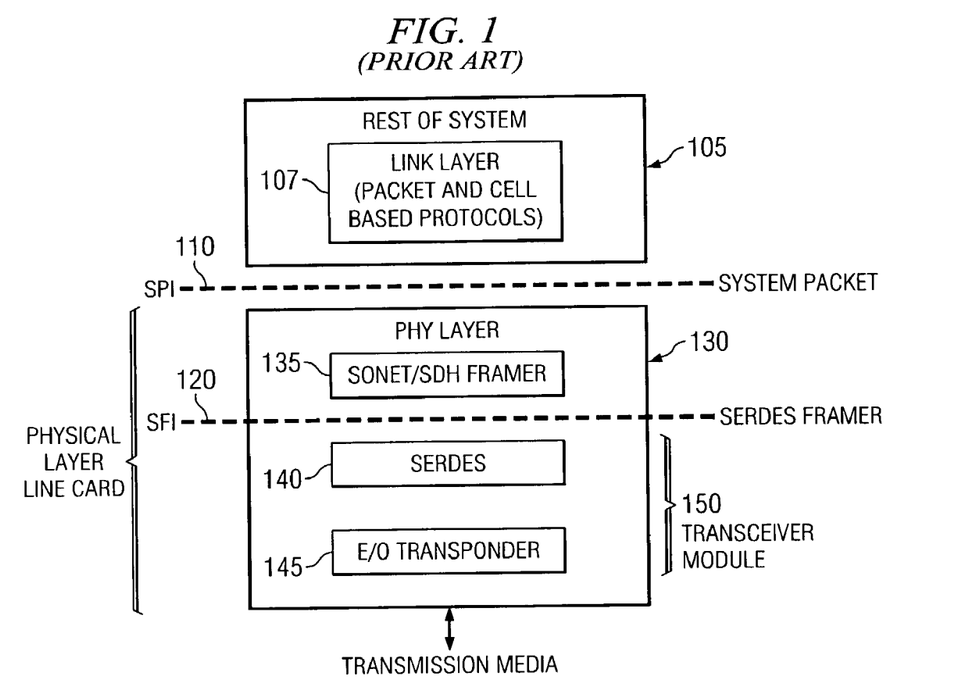
FIG. 1 diagrammatically illustrates the components of a conventional line card in accordance with the known art.

A typical line card used in optical networking equipment consists of multiple modules for translating network packets into a format suitable for transmission over the optical media. In a synchronous optical network/synchronous digital hierarchy ("SONET/SDH") system, the translation components consist of a framer device for translation between data packets and SONET/SDH frames, a serializer/deserializer ("SERDES") component for conversion of the parallel data-and-clock input/output of the framer to the self-clocking serial data required for transmission, and a transceiver that performs the electrical/optical conversion and the optical transmit/receive function. FIG. 1 diagrammatically illustrates the components of a conventional line card 130 in accordance with the known art.

As illustrated in FIG. 1, there are two (2) electrical interfaces within a SONET/SDH based communication system: system packet interface ("SPI") 110 and SERDES framer interface ("SFI") 120. SPI 110 is the electrical interface between physical layer ("PHY") 130 and link layer 107 which communicates with the rest of system 105. SPI 110 separates synchronous PHY 130 from the asynchronous packet-based processing performed by the higher layers of system 105. SPI 110 supports transmit and receive data transfers at clock rates independent of actual line bit rates. It is designed for the efficient transfer of both variable-sized packet and fixed-sized cell data. SFI 120 defines an electrical interface between SONET/SDH framer 135 and the high-speed logic of SERDES 140. SERDES 140 serializes (parallel-to-serial) and de-serializes (serial-to-parallel) data. SFI 120 permits SERDES 140 and framer 135 to be implemented in different speed technologies. In practice, the framer 135 to SERDES 140 interface (SFI 120) is often referred to as the framer-to-transceiver interface due to the frequent combination of SERDES 140 and transponder components 145 into a single module 150. Both SPI 110 and SFI 120 can provide a standard interface to internal networking components. This standardization of PHY 130 leads to lower costs. Because of evolving transmission speeds and technology enhancements, a number of different variations of these electrical interfaces have been defined, such as SPI-3, SPI-4, SFI-4 and SFI-5.

Figure 2:
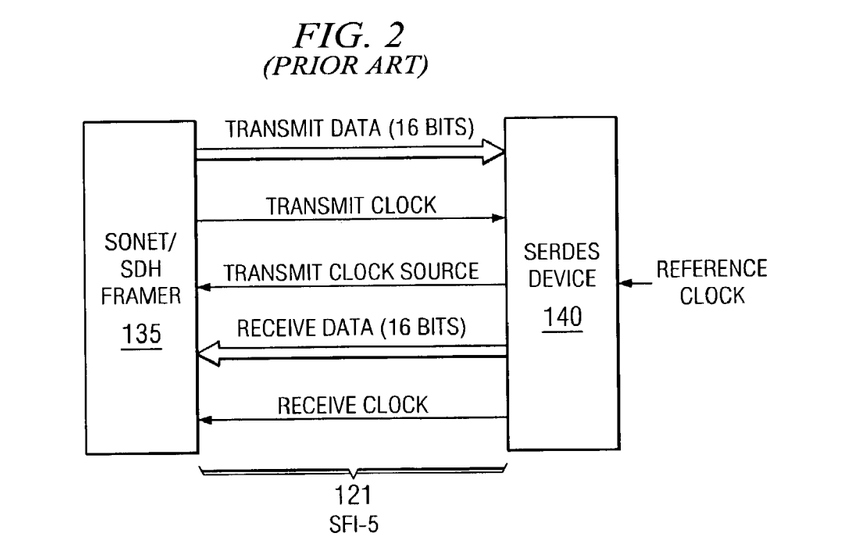
FIG. 2 diagrammatically illustrates a conventional SFI-5 interface in accordance with the known art.

In the case of the SFI-4 specification, the framer-to-SERDES interface is optimized for the pure transfer of data. There is no protocol, or framing, involved in data transfers. An SFI-4 interface can include a 16-bit wide data bus with each channel operating at 622 MHz. With a maximum bus bandwidth of 12.12 Gbps, SFI-4 can support the optical carrier ("OC") data rate, OC-192. FIG. 2 diagrammatically illustrates a conventional SFI-5 interface 121 in accordance with the known art. An SFI-5 interface includes a 16-bit wide data bus with each channel operating at up to 3.125 Gbps. SFI-5 has a maximum bus bandwidth of 50 Gbps and can support the OC-768 data rate, which is currently the fastest SONET data transmission rate.

Single-chip interface converters are being developed to support optical networking applications that use both 10 Gbps and 40 Gbps data rates. These single-chip converters provide standards-based products that enable service providers to cost-effectively transition to higher data rates while preserving legacy system applications. This allows service providers to leverage existing 10 Gbps components with SFI-4 interfaces while deploying 40 Gbps systems with SFI-5 interfaces.

Figure 3:
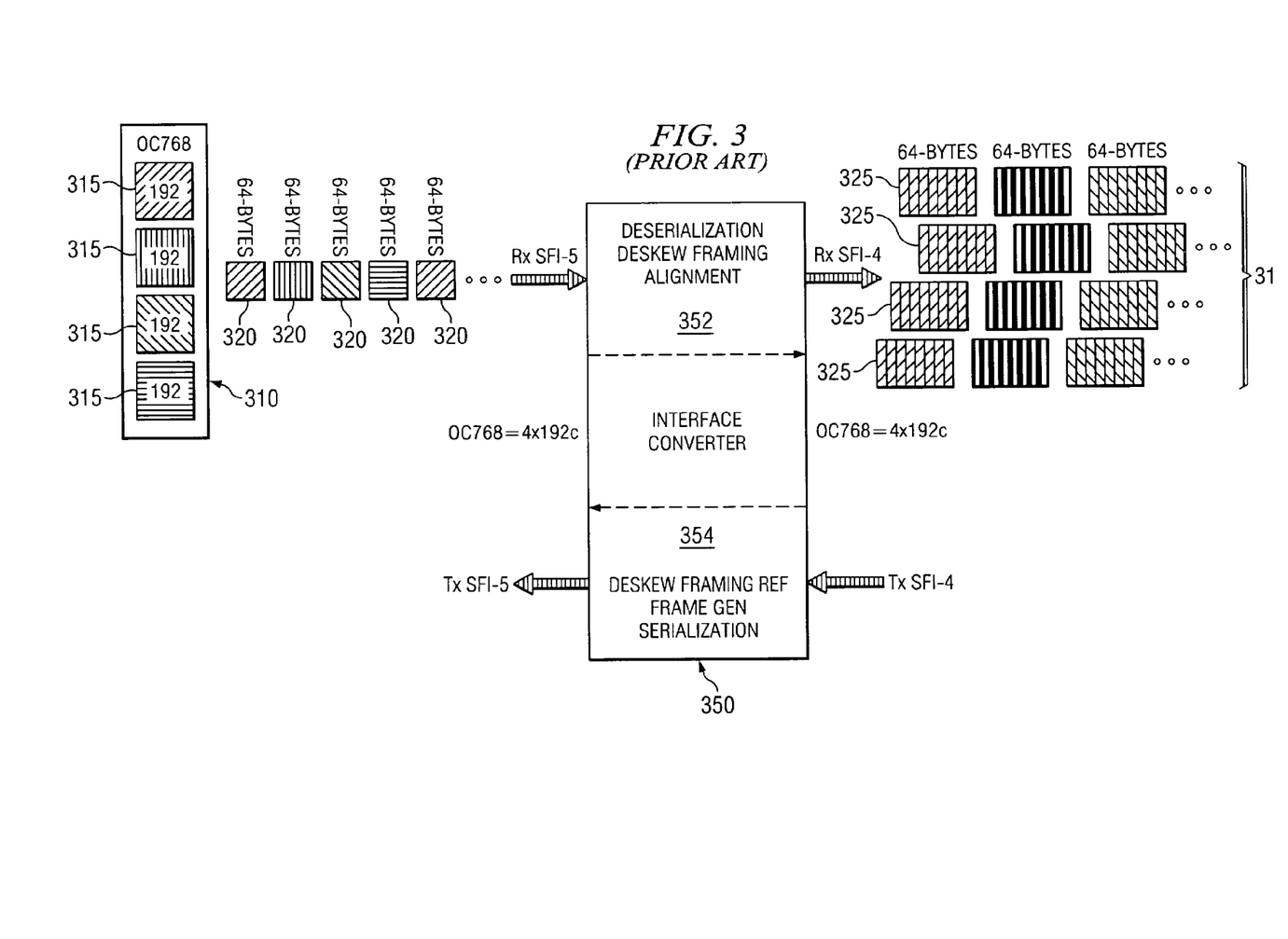
FIG. 3 diagrammatically illustrates conventional SFI-4 and SFI-5 data multiplexing and striping in accordance with the known art.

Referring to FIG. 3, an OC-768 frame 310, such as that used by an SFI-5 interface, includes four (4) OC-192 frames 315, multiplexed 64 bytes at a time as shown at 320. Interface converter 350 is primarily a MUX/DEMUX device that operates as a translator, transforming signals between the high-speed (SFI-5) side and the low-speed (SFI-4) side. The data stream of an SFI-4 interface is striped across four (4) ports 325. This is diagrammatically illustrated in FIG. 3, portions of which are described in greater detail below with reference to FIG. 4.

When OC-768 SONET frames are converted from SFI-5 format to SFI-4 format, it is extremely difficult to prove frame integrity at the output using existing OC-192 transponders. This is because the 4×16 data lanes at 31 are still multiplexed and may be skewed with respect to one another. Additionally, extracting 64 bytes per OC-192 frame though a field programmable gate array ("FPGA") is not realistic, as the extraction timepoint is not defined. Currently, OC-768 transponders are not available. Even if they were, the 4×16 data lanes may still be skewed with respect to one another and therefore could not be fed "as-is" to the transponder. The conversion verification between SFI-4 and SFI-5 in a single-chip interface converter currently requires connecting the converter to a framer and then validating the output of the framer, which has OC-192 frames, bifurcated per port. This involves communication between two (2) chips and increases the difficulty of problem isolation.

It is therefore desirable to provide a solution that enables interface conversion verification with a single chip and improves problem isolation. Exemplary embodiments of the present invention can provide this by modifying the input data pattern (e.g., creating a 40G, or pseudo OC-768, frame by multiplexing four OC-192 frames, two bytes at a time) to provide per port demultiplexing of data streams at the output of the interface converter.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of synchronous optical networks ("SONET"), it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention provides a solution that enables interface conversion verification with a single chip and improves problem isolation. Exemplary embodiments of the present invention can provide this by modifying the input data pattern (e.g., creating a 40G, or pseudo OC-768, frame by multiplexing four OC-192 frames, two bytes at a time) to provide per port demultiplexing of data streams at the output of the interface converter.

Figure 4:
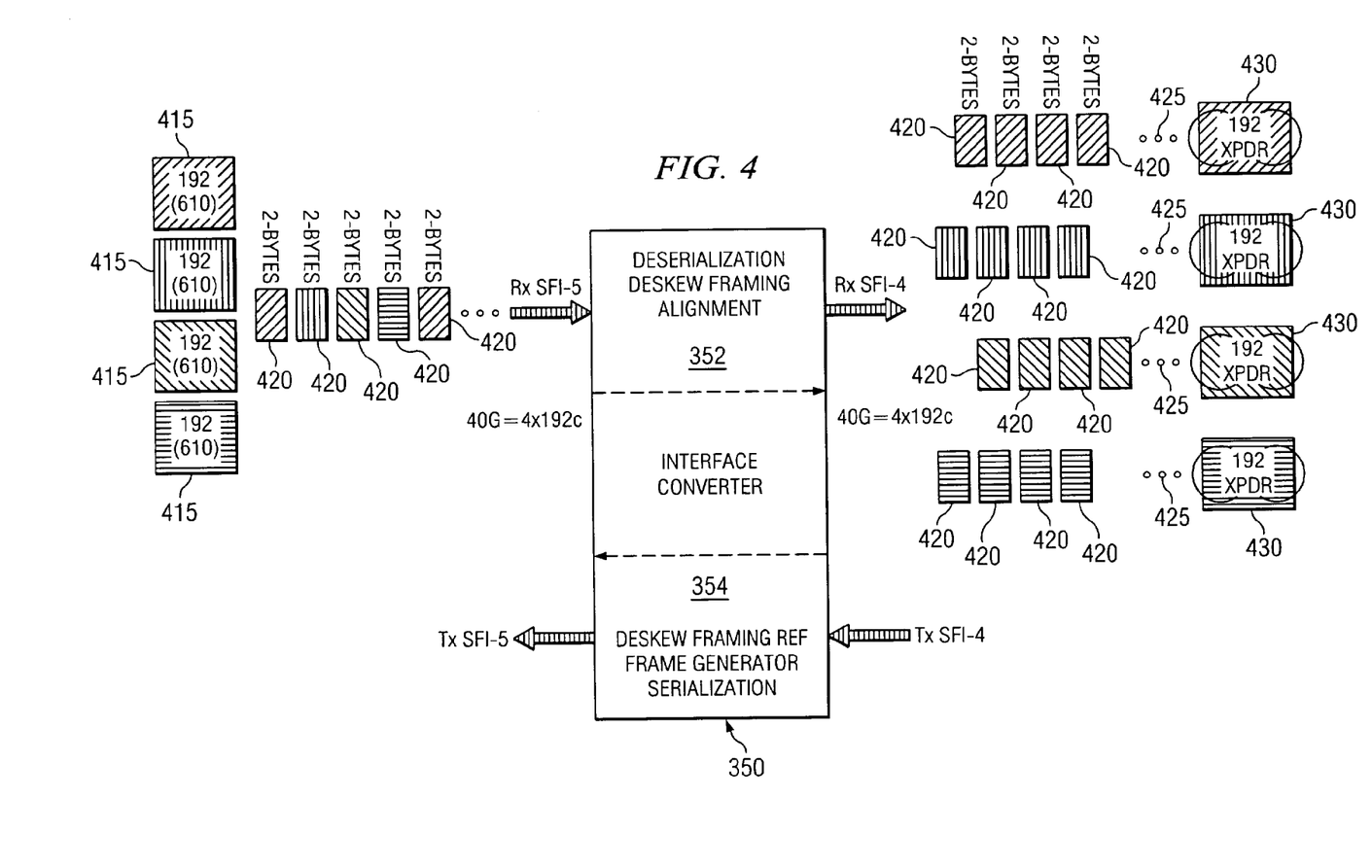
FIG. 4 diagrammatically illustrates interface conversion verification in accordance with exemplary embodiments of the present invention.

In some exemplary embodiments, such as FIG. 4, a 40G (pseudo OC-768) frame can be created by multiplexing four (4) OC-192 frames 415, two (2) bytes at a time as shown at 420. The 40G frame can be input on the high-speed side (e.g., SFI-5) of interface converter 350. In some embodiments, interface converter 350 is the same as used in the prior art arrangement of FIG. 3. The data stream that then comes out on the low-speed side (e.g., SFI-4) of interface converter 350 is divided into four (4) OC-192 frames 420, each frame striped on a different port 425. Four (4) OC-192 transponders ("XPDR") 430 can be connected to validate the data stream. Critical functions (e.g., deserialization, deskew, framing and alignment) in the Rx direction can therefore be validated even in the absence of a true OC-768 frame. Similarly, validation of functions in the Tx direction can also be accomplished. Therefore, an additional framer device, as conventionally used, is not needed, resulting in faster verification times. Furthermore, board design is simplified and more cost-effective, particularly with the omission of an additional framer device.

An exemplary interface converter 350 can include a low-speed side and a high-speed side. The low-speed side can include four (4) interfaces, each capable of handling 16 bits at 622 Mb/s. The low-speed side can operate as a single synchronous transport signal ("STS"), such as STS-768 with 64 bits at 622 Mb/s, or as a quad STS-192 with four (4) interfaces, each with 16 bits at 622 Mb/s. The high-speed side can provide a 16 bit at 2.5 GB/s interface operating either as a single high-speed interface or as quad high-speed interfaces. The high-speed side can contain a clock recovery module on the receive interface (not shown) and a clock synthesis module on the transmit side (not shown). Normally, high speed Rx data is accompanied by a source synchronous clock that will be at one quarter the data rate. Optionally, the source synchronous clock may be at one half the data rate. Converter 350 can also provide flexibility for different mapping schemes between the input and the output data. The mapping flexibility and the interface selection flexibility enable converter 350 to be used in different modes, such as an STS-768 1:4 MUX and DEMUX or in quad STS-192 applications.

A high speed analog SERDES macro within converter 350 can include Rx block 352 with a receive module that can perform deserialization of the data received from the external optical module (not shown). The macro can provide clock/data recovery ("CDR"), phase recovery, clock synthesis, and serial to parallel data conversion functions. Within the deserialization process, each high-speed data lane is parallelized into an 8-bit data stream and clocked at a lower frequency inside the core.

An Rx deskew block within Rx block 352 can compensate for the skew introduced between the sixteen (16) input Rx data lines by connections from the external optical module. An exemplary maximum differential skew introduced can be specified at 4 UI (clock unit intervals). With respect to the earliest arriving signal, each of the other signals can be coincident or either 1, 2, 3 or 4 UI late. The delay in each of the signals is measured with respect to the reference deskew lane/channel. The deskew lane has a fixed format that includes an A1A2 framing pattern along with 64 bits from each of the 16 data lanes in succession. This pattern can be repeated indefinitely. The deskew operation can be continuous and need not depend on the alignment state of the interface. The high-speed deskew channel can be modified as described in greater detail with reference to FIG. 7.

The Rx framer module within Rx block 352 can provide the following: framing pattern (A1A2) match and frame alignment for STS-192, STS-768 and STS-768C frames, descrambling of incoming STS-768C frames, scrambling of outgoing STS-192 data, compensation of B1 and B2, and frame, row, column and sub-column counters. Framing is the process of locking onto the periodic A1A2 pattern to ensure the quality of SONET frames being received. The bit aligner aligns the data received from the deskew module. The alignment is based on the transition between A1 and A2 bytes in the SONET frame. The first byte of the aligner output data occupies the most significant byte position and the last byte occupies the least significant byte position of a 128-bit data bus.

Tx block 354 can include the capabilities of deskew, framing, reference frame generation and serialization in the Tx direction. The Tx low-speed deskew module within Tx block 354 can compensate for the skew introduced between the four (4) framer transit lanes due to the connections between the external framer and converter 350. Up to 11 UI of skew can be compensated. For deskew, the data from one of the OC-192 channels is used as the master. Since the incoming data is byte-aligned, each data lane will contain an A1A2 transition. This transition is used to determine the skew between the four (4) data lanes.

The Tx framer module within Tx block 354 can provide framing pattern match and frame alignment for STS-768 frames, descrambling of incoming STS-768 frames, scrambling of outgoing STS-768C data, compensation of B1 and B2, monitoring for loss of pointer ("LOP"), and frame, row, column and sub-column counters.

The reference frame generation ("Ref Frame Gen") module within Tx block 354 can generate the data going out on the Tx deskew reference lane/channel. The deskew lane has a fixed format that includes the A1A2 framing pattern along with 64 bits from each of the 16 data lanes in succession. This pattern can be repeated indefinitely.

The high speed analog SERDES macro within converter 350 can include a transmit module within Tx block 354 that can perform serialization. The macro can provide clock synthesis and parallel to serial data conversion functions. Within the serialization process, each internal (i.e., inside the core) 8-bit low-speed data bus is serialized into a single bit higher speed data lane for transmission to the external optical module (not shown).

Figure 5:
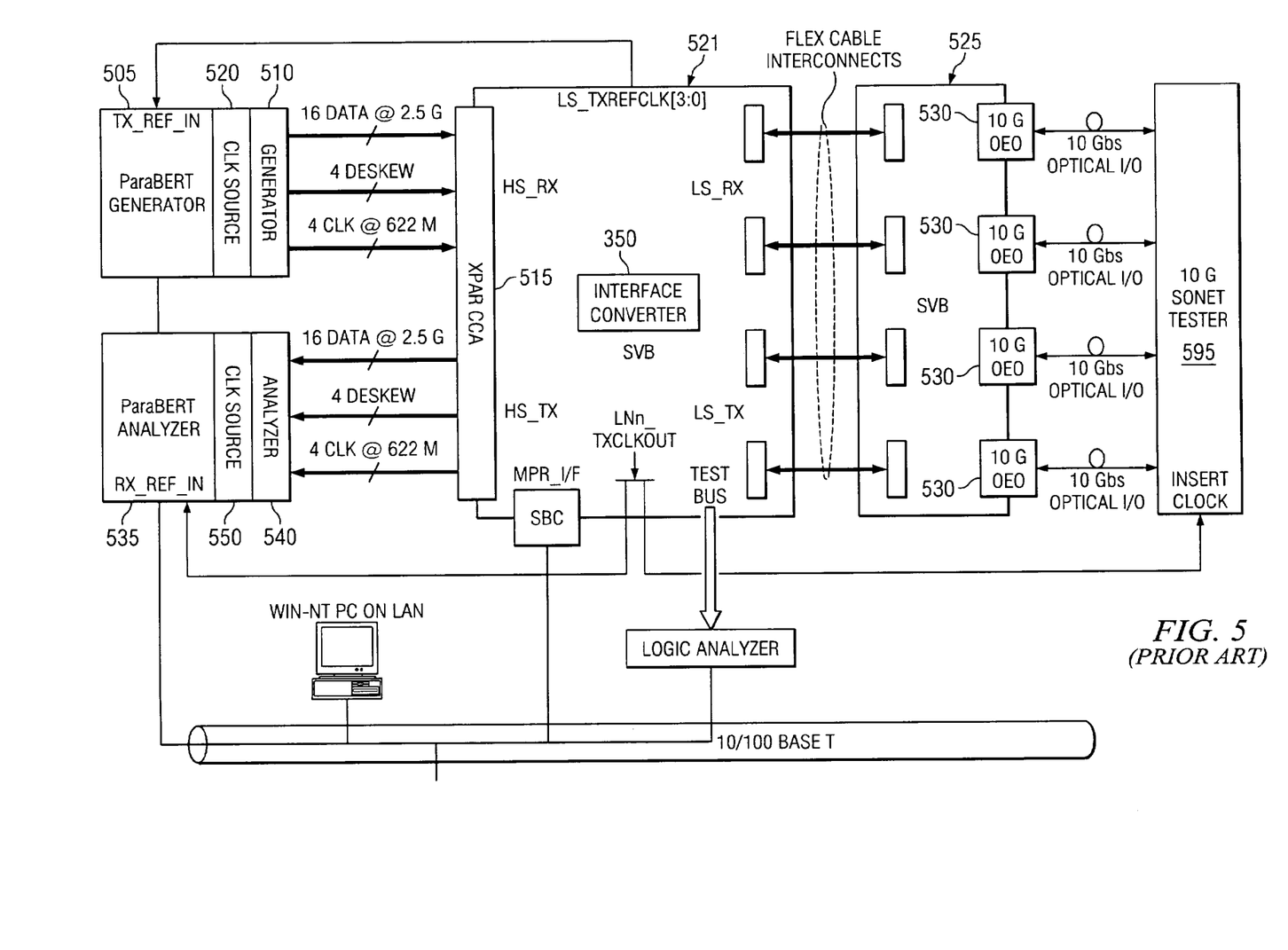
FIG. 5 diagrammatically illustrates a conventional hardware configuration for interface conversion verification in accordance with the known art.

FIG. 5 diagrammatically illustrates a conventional hardware configuration for interface conversion verification in accordance with the known art. In order to validate a single-chip interface converter, such as converter 350, in the Rx direction, the payload of the high-speed frames (e.g., SFI-5) can be programmed into parallel bit error ratio tester ("ParaBERT") 505 using, for example, input data files. A ParaBERT generator, such as ParaBERT 505, has the ability to send frames at 2.5 Gbps and can be configured as a single logical generator 510 synchronous to clock source 520 capable of generating an OC-768 frame, such as frame 310 (FIG. 3) which is comprised of four (4) OC-192 frames 315, interleaved 64 bytes at a time, to interface converter system validation board ("SVB") 521 through chip card adapter ("CCA") 515. 10G SONET tester 595 has the ability to synchronize to the A1A2 framing patterns produced by an interface converter, such as converter 350. If an input data file has been used to program ParaBERT 505, that same file can be used by 10G SONET tester 595 to validate the data output by converter 350. However, the data streams produced by SVB 521 are no longer pure OC-192 data streams because of the striping across ports on the low-speed side (e.g., SFI-4) illustrated in FIG. 3. Therefore, in order to get pure OC-192 data streams that can be fed into 10G SONET tester 595, the data streams must be fed from SVB 521 through a second system validation board, such as SVB 525, prior to their input to 10G SONET tester 595 through 10G optical-electrical-optical ("OEO") interfaces 530. Verification in the Tx direction functions similarly, with true OC-768 data received in the Tx direction being analyzed by ParaBERT analyzer 535 configured as single analyzer 540 synchronous to clock source 550.

Figure 6:
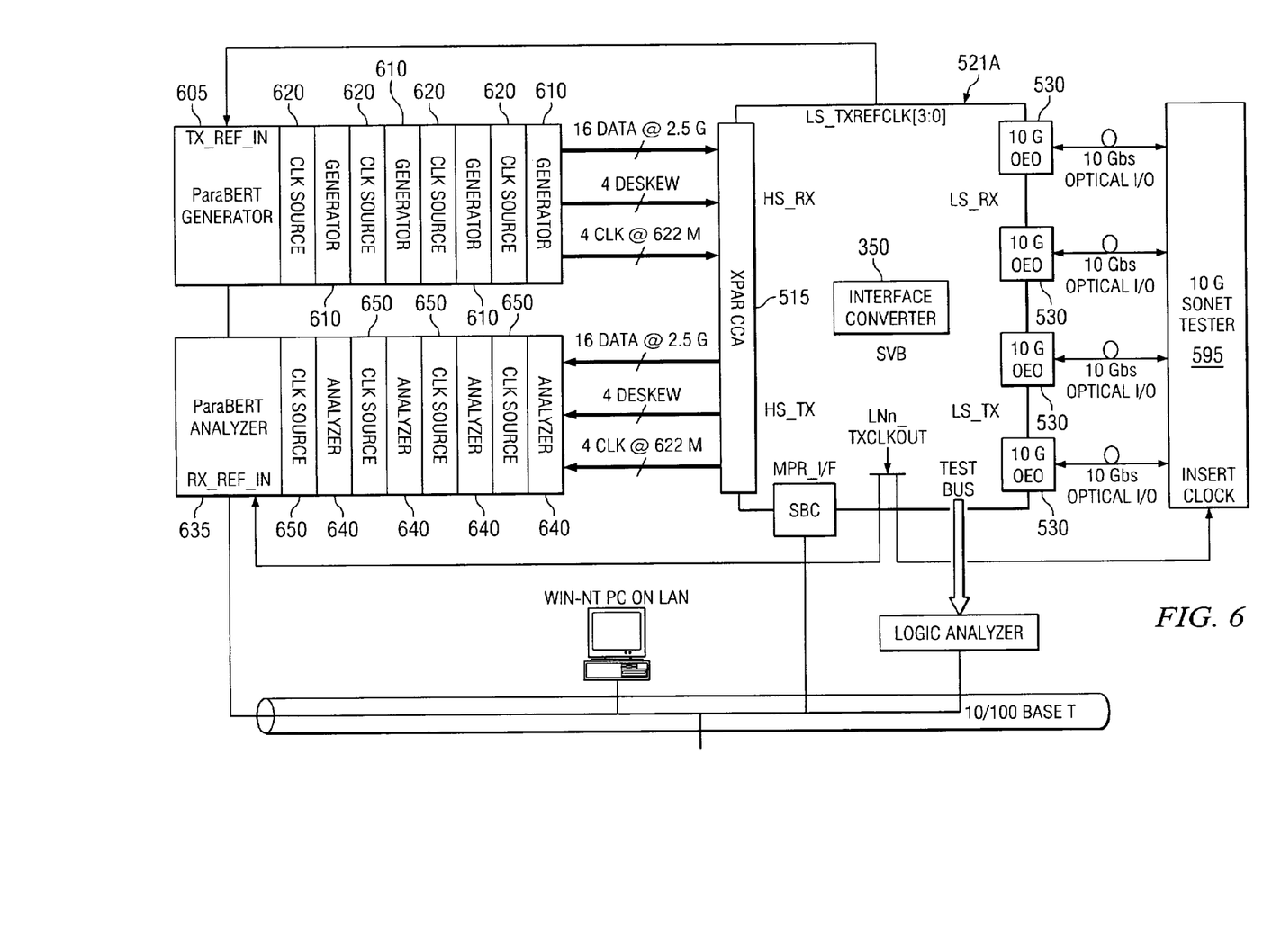
FIG. 6 diagrammatically illustrates an exemplary embodiment of a hardware configuration for interface conversion verification in accordance with exemplary embodiments of the present invention.

In the exemplary embodiment of the present invention diagrammatically illustrated in FIG. 6, the payload of the high-speed frames (e.g., SFI-5) can be programmed into ParaBERT 605, using, for example, a data file that can result in the production of a 40G frame, as illustrated in FIG. 4, which is not a true OC-768 frame, although the bandwidth is the same. As shown in FIG. 4, the 40G frame can be comprised of four (4) OC-192 frames 415, interleaved two (2) bytes at a time. In order to generate a 40G frame configured thusly, ParaBERT 605 can be configured as four (4) generators 610, each synchronous to a corresponding clock source 620. In some embodiments, multiple generators 610 can be synchronous to a single clock source 620. Configuration of ParaBERT generators in the manners described above can be readily accomplished by workers in the art. The data streams produced by SVB 521A are true OC-192 data streams and may therefore be input to 10G SONET tester 595 through 10G OEO interfaces 530 (provided on SVB 521A) without any further conversion by a second SVB (see SVB 525 of FIG. 5). Thus, in some embodiments, SVB 521A differs from SVB 521 (FIG. 5) only in that the 10G OEO interfaces are provided on SVB 521A. Again, a data file input to ParaBERT 605 can also be used by 10G SONET tester 595 to validate the data output by converter 350. Verification in the Tx direction functions similarly, with a 40G bandwidth frame received in the Tx direction being demultiplexed and fed to ParaBERT analyzer 635 configured as multiple analyzers 640, each synchronous to a corresponding clock source 650. In some embodiments, multiple analyzers 640 can be synchronous to a single clock source 650.

Figure 7:
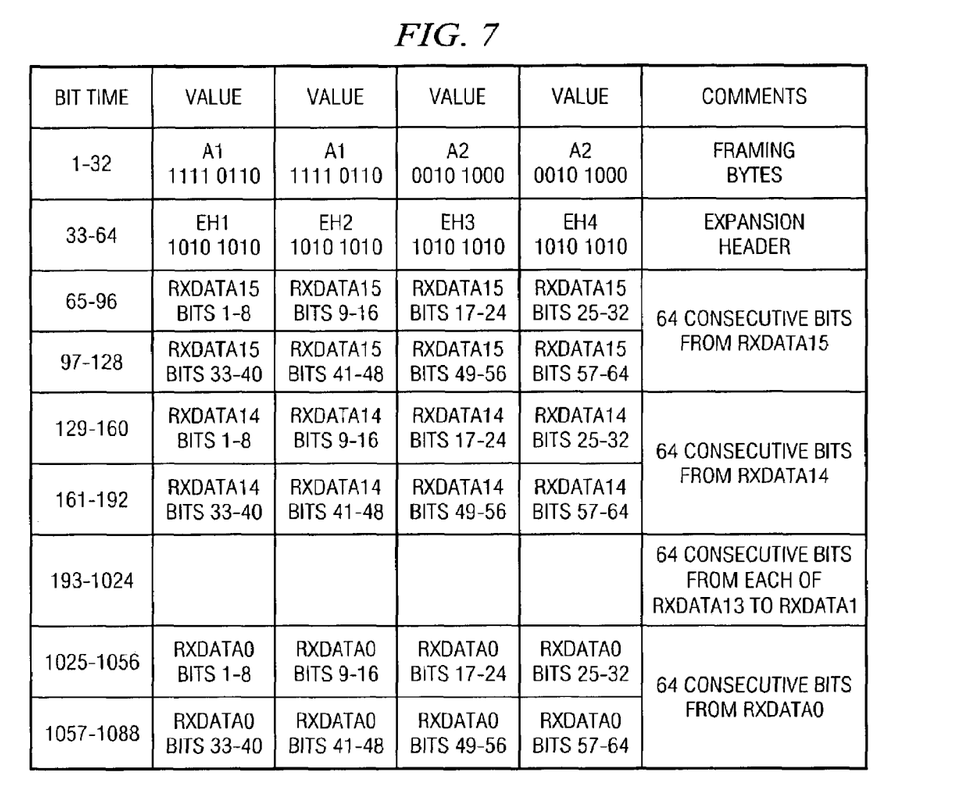
FIG. 7 illustrates in tabular form an exemplary composition of a single deskew channel/reference frame in accordance with the known art.

FIG. 7 illustrates in tabular form an exemplary composition of a single deskew channel/reference frame in accordance with the known art. The deskew lane has a fixed format that includes the A1A2 framing pattern along with 64 bits from each of the 16 data lanes in succession. This pattern can be repeated indefinitely. Because the reference frame is derived from real time data present on the 16 data lanes, any manipulation of this data will directly result in a manipulation of the reference frame, thereby enabling successful deskew. Although the structure of the reference frame can remain the same, implementation of the present invention will change the data. The differences can be illustrated by using RXDATA15 as an example. The lanes shown below are the 16 input lanes for RX SFI-5. Let A=bit from OC-192 channel 1, B=bit from OC-192 channel 2, C=bit from OC-192 channel 3 and D=bit from OC-192 channel 4.

In the conventional configuration illustrated in FIG. 3, four (4) OC-192 frames 315 are interleaved 64 bytes at a time. The first 64 bits of RXDATA15 are: AAAAAAAAAAAAAAAAAAAAAAAAAAAAAAAA BBBBBBBBBBBBBBBBBBBB BBBBBBBBBBBBBB. The corresponding lane/bit numbers with data would be as follows, where AA . . . A represents 32 consecutive bits from OC-192 channel 1, BB . . . B represents 32 consecutive bits from OC-192 channel 2, and so on:

| Lane | Bit No. 1 | 32 | 64 | 96 | 128 | | | | |
|---|---|---|---|---|---|---|---|---|---|
| RXDATA15 | AA . . . | ABB . . . | BCC . . . | CDD . . . | DAA . . . | ABB . . . | BCC . . . | CDD . . . | D . . . |
| RXDATA14 | AA . . . | ABB . . . | BCC . . . | CDD . . . | DAA . . . | ABB . . . | BCC . . . | CDD . . . | D . . . |
| RXDATA13 | AA . . . | ABB . . . | BCC . . . | CDD . . . | DAA . . . | ABB . . . | BCC . . . | CDD . . . | D . . . |
| RXDATA12 | AA . . . | ABB . . . | BCC . . . | CDD . . . | DAA . . . | ABB . . . | BCC . . . | CDD . . . | D . . . |
| RXDATA11 | AA . . . | ABB . . . | BCC . . . | CDD . . . | DAA . . . | ABB . . . | BCC . . . | CDD . . . | D . . . |
| RXDATA10 | AA . . . | ABB . . . | BCC . . . | CDD . . . | DAA . . . | ABB . . . | BCC . . . | CDD . . . | D . . . |
| RXDATA9 | AA . . . | ABB . . . | BCC . . . | CDD . . . | DAA . . . | ABB . . . | BCC . . . | CDD . . . | D . . . |
| RXDATA8 | AA . . . | ABB . . . | BCC . . . | CDD . . . | DAA . . . | ABB . . . | BCC . . . | CDD . . . | D . . . |
| RXDATA7 | AA . . . | ABB . . . | BCC . . . | CDD . . . | DAA . . . | ABB . . . | BCC . . . | CDD . . . | D . . . |
| RXDATA6 | AA . . . | ABB . . . | BCC . . . | CDD . . . | DAA . . . | ABB . . . | BCC . . . | CDD . . . | D . . . |
| RXDATA5 | AA . . . | ABB . . . | BCC . . . | CDD . . . | DAA . . . | ABB . . . | BCC . . . | CDD . . . | D . . . |
| RXDATA4 | AA . . . | ABB . . . | BCC . . . | CDD . . . | DAA . . . | ABB . . . | BCC . . . | CDD . . . | D . . . |
| RXDATA3 | AA . . . | ABB . . . | BCC . . . | CDD . . . | DAA . . . | ABB . . . | BCC . . . | CDD . . . | D . . . |
| RXDATA2 | AA . . . | ABB . . . | BCC . . . | CDD . . . | DAA . . . | ABB . . . | BCC . . . | CDD . . . | D . . . |
| RXDATA1 | AA . . . | ABB . . . | BCC . . . | CDD . . . | DAA . . . | ABB . . . | BCC . . . | CDD . . . | D . . . |
| RXDATA0 | AA . . . | ABB . . . | BCC . . . | CDD . . . | DAA . . . | ABB . . . | BCC . . . | CDD . . . | D . . . |

In the exemplary configuration illustrated in FIG. 4, four (4) OC-192 frames 415 are interleaved 2 bytes 420 at a time. So the first 64 bits of RXDATA15 become: ABCDABCD-ABCDABCDABCDABCDABCDABCDABCD-ABCDABCDABCDABC DABCDABCDABCD. Therefore, the corresponding lane/bit numbers with data would be:

| Lane | Bit No. 1 ... 32 ... |
|---|---|
| RXDATA15 | ABCDABCDABCDABCDABCDABCDABCDABCD ... |
| RXDATA14 | ABCDABCDABCDABCDABCDABCDABCDABCD ... |
| RXDATA13 | ABCDABCDABCDABCDABCDABCDABCDABCD ... |
| RXDATA12 | ABCDABCDABCDABCDABCDABCDABCDABCD ... |
| RXDATA11 | ABCDABCDABCDABCDABCDABCDABCDABCD ... |
| RXDATA10 | ABCDABCDABCDABCDABCDABCDABCDABCD ... |
| RXDATA9 | ABCDABCDABCDABCDABCDABCDABCDABCD ... |
| RXDATA8 | ABCDABCDABCDABCDABCDABCDABCDABCD ... |
| RXDATA7 | ABCDABCDABCDABCDABCDABCDABCDABCD ... |
| RXDATA6 | ABCDABCDABCDABCDABCDABCDABCDABCD ... |
| RXDATA5 | ABCDABCDABCDABCDABCDABCDABCDABCD ... |
| RXDATA4 | ABCDABCDABCDABCDABCDABCDABCDABCD ... |
| RXDATA3 | ABCDABCDABCDABCDABCDABCDABCDABCD ... |
| RXDATA2 | ABCDABCDABCDABCDABCDABCDABCDABCD ... |
| RXDATA1 | ABCDABCDABCDABCDABCDABCDABCDABCD ... |
| RXDATA0 | ABCDABCDABCDABCDABCDABCDABCDABCD ... |

It will be evident to workers in the art that the exemplary embodiments described above can be readily implemented, for example, by suitable modifications in software, hardware or a combination of software and hardware in conventional SFI converter verification arrangements.

Although exemplary embodiments of the present invention have been described in detail, it will be understood by those skilled in the art that various modifications can be made therein without departing from the spirit and scope of the invention as set forth in the appended claims.

What is claimed is:

1. A method for testing a data communication device that normally operates on an input data stream including a plurality of data channels timewise interleaved according to a first format, comprising:
   providing test input data corresponding to each of the data channels;
   generating from the test input data a test input data stream wherein the data channels are timewise interleaved according to a second format that differs from said first format;
   applying the test input data stream to the data communication device;
   receiving from the data communication device a test output data stream produced by the data communication device in response to the test input data stream; and
   using the test output data stream to verify operation of the data communication device.

2. The method of claim 1, wherein said first format is OC-768 format.

3. The method of claim 1, wherein said second format is 40G format.

4. The method of claim 3, wherein said first format is OC-768 format.

5. The method of claim 1, wherein said receiving step includes receiving in parallel a plurality of said test output data streams produced by the data communication device in response to said test input data stream, each of said test output data streams respectively corresponding to one of said data channels.

6. The method of claim 5, wherein said first format is OC-768 format, said second format is 40G format and said test output data streams are OC-192 data streams.

7. The method of claim 1, wherein, in said first format, blocks of data of a first size and respectively corresponding to said data channels are timewise interleaved with one another, and wherein, in said second format, blocks of data of a second size and respectively corresponding to said data channels are timewise interleaved with one another, said blocks of said first size differing in size from said blocks of said second size.

8. The method of claim 7, wherein said blocks of said first size are larger than said blocks of said second size.

9. The method of claim 8, wherein said blocks of said first size are 64 byte blocks and said blocks of said second size are 2 byte blocks.

10. The method of claim 1, wherein the data communication device is an interface converter for converting between first and second SONET/SDH interfaces.

11. The method of claim 10, wherein one of said first and second interfaces is an SFI-5 interface, and wherein the input data stream on which the data communication device normally operates is an output of the SFI-5 interface.

12. An apparatus for testing a data communication device that normally operates on an input data stream including a plurality of data channels timewise interleaved according to a first format, comprising:
   an input for receiving test input data corresponding to each of said data channels;
   a test data generator coupled to said input for generating in response to said test input data a test input data stream wherein said data channels are timewise interleaved according to a second format that differs from said first format, said test data generator having an output coupled to said data communication device for applying said test input data stream to said data communication device;
   said data communication device for producing a test output data stream in response to said test input data stream, said data communication device having an output for providing said test output data stream; and
   a verifier coupled to said output of said data communication device for using said test output data stream to verify operation of said data communication device.

13. The apparatus of claim 12, wherein said first format is OC-768 format.

14. The apparatus of claim 12, wherein said second format is 40G format.

15. The apparatus of claim 14, wherein said first format is OC-768 format.

16. The apparatus of claim 12, wherein said data communication device is responsive to said test input data stream for producing in parallel a plurality of said test output data streams, each of said test output data streams respectively corresponding to one of said data channels.

17. The apparatus of claim 16, wherein said first format is OC-768 format, said second format is 40G format and said test output data streams are OC-192 data streams.

18. The apparatus of claim 12, wherein, in said first format, blocks of data of a first size and respectively corresponding to said data channels are timewise interleaved with one another, and wherein, in said second format, blocks of data of a second size and respectively corresponding to said data channels are timewise interleaved with one another, said blocks of said first size differing in size from said blocks of said second size.

19. The apparatus of claim 18, wherein said blocks of said first size are larger than said blocks of said second size.

20. The apparatus of claim 19, wherein said blocks of said first size are 64 byte blocks and said blocks of said second size are 2 byte blocks.

21. The apparatus of claim 12, wherein the data communication device is an interface converter for converting between first and second SONET/SDH interfaces.

22. The apparatus of claim 21, wherein one of said first and second interfaces is an SFI-5 interface, and wherein the input data stream on which the data communication device normally operates is an output of the SFI-5 interface.

* * * * *